United States Patent [19]

Sekiya

[11] 3,883,813

[45] May 13, 1975

[54] LOW-FREQUENCY POWER AMPLIFIER

[75] Inventor: Mamoru Sekiya, Nagoya, Japan

[73] Assignee: Shin-Shirasuna Electric Corporation, Nagoya-shi, Aichi-ken, Japan

[22] Filed: Feb. 11, 1974

[21] Appl. No.: 441,420

[30] Foreign Application Priority Data

July 19, 1973 Japan .............................. 48-82268

[52] U.S. Cl. ...................... 330/13; 330/17; 330/22; 330/24

[51] Int. Cl. .............................................. H03f 3/18

[58] Field of Search ............ 330/13, 15, 17, 18, 22, 330/24, 40, 151

[56] References Cited

UNITED STATES PATENTS

| | | | |
|---|---|---|---|
| 3,550,025 | 12/1970 | Stodolsky | 330/17 |
| 3,611,170 | 10/1971 | Wheatley | 330/17 X |

*Primary Examiner*—James B. Mullins

[57] ABSTRACT

In a low-frequency power amplifier designed for Class B or AB operation which comprises a first complementary pair of transistors connected in the form of Darlington connection, and a second complementary pair of transistors connected in the form of Darlington connection, there is provided means for permitting a bias current to flow through said transistors, whether or not there is an input signal, thereby preventing notching distortion.

1 Claim, 2 Drawing Figures

LOW-FREQUENCY POWER AMPLIFIER

This invention relates to improvements in low-frequency power amplifier circuits.

Most of the low-frequency power transistor amplifiers which have extensively been used heretofore, are single-ended push-pull (referred to as SEPP hereinafter) circuits, especially complementary SEPP circuits using complementary pairs of transistors connected in the form of Darlington connection. Such circuits are commonly designed for class B or AB push-pull operation which is advantageous in respect of power source capacity, collector loss, type of heat dissipating means, etc. With such circuit arrangements, however, there inevitably occur crossover distortion, notching distortion and so forth. Crossover distortion can be prevented by flowing a high bias current through each transistor, whereas notching distortion cannot be avoided unless an arrangement for class A operation is adopted, since such distortion is one which results from switching of the transistors. Obviously, class A operation is disadvantageous in that it is accompanied by much greater power loss.

Accordingly, it is a primary object of this invention to provide a low-frequency power amplifier circuit arrangement which is designed for class B or AB operation and yet free from not only crossover distortion but also notching distortion.

According to an aspect of this invention, there is provided a low-frequency power amplifier circuit arrangement designed for Class B or AB operation, comprising a first transistor of a first conductivity type, a second transistor of a second conductivity type having the base thereof connected with the collector of said first transistor, a first diode having the positive and negative electrodes thereof connected to the emitter of said first transistor and the collector of said second transistor respectively, a third transistor of said second conductivity type, a fourth transistor of said first conductivity type having the base thereof connected with the collector of said third transistor, a second diode having the negative and positive electrodes thereof connected to the emitter of said third transistor and the collector of said fourth transistor respectively, a resistor connected between the emitters of said first and third transistors, and a bias circuit means connected between the bases of said first and third transistors, the collectors of said second and fourth transistors being connected to a load.

Figure 1:
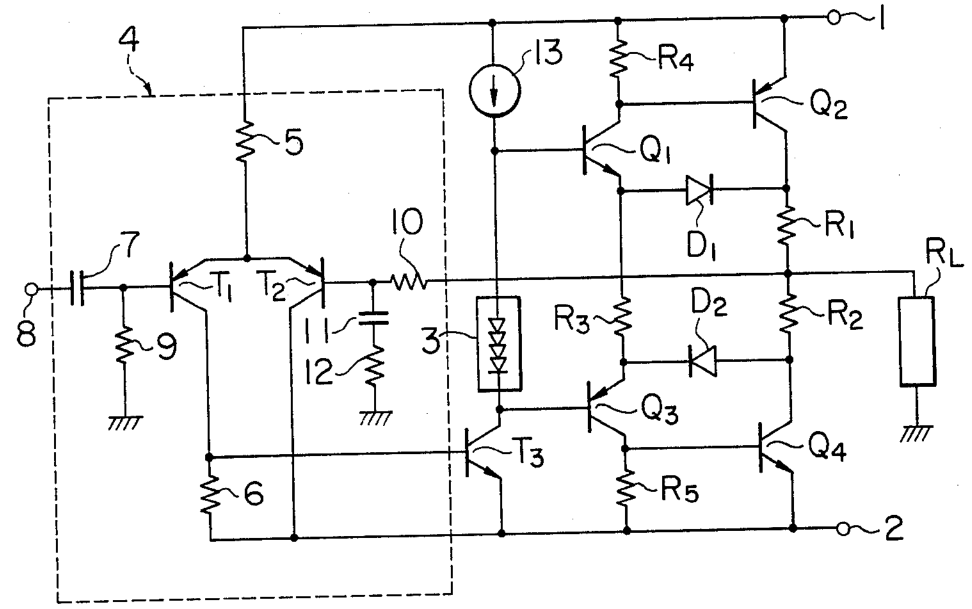
Figure 2:
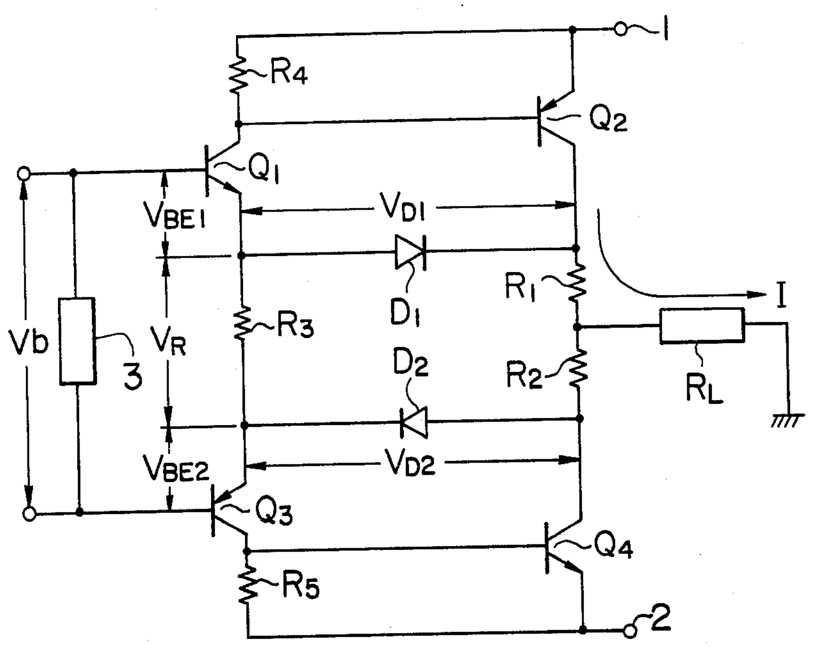

Other objects, features and advantages of this invention will become apparent from the following description taken in conjunction with the accompanying drawings, in which:

FIG. 1 is a schematic circuit diagram showing the low-frequency power amplifier according to an embodiment of this invention; and FIG. 2 is a view useful for explaining the operation of the amplifier shown in FIG. 1.

Referring to FIG. 1, a differential amplifier 4 is provided which comprises a pair of PNP transistors $T_1$ and $T_2$ the emitters of which are coupled to each other and to a power source terminal 1 through a resistor 5. The collector of the transistor $T_2$ is coupled direct to another power source terminal 2 to which is also coupled the collector of the transistor $T_1$ through a resistor 6. To the base of the transistor $T_1$ are connected a capacitor 7 the other end of which constitutes an input terminal 8, and a resistor 9 which is grounded at the other end. The base of the transistor $T_2$ is connected to a load $R_L$ through a resistor 10 and also grounded through a series circuit of a capacitor 11 and resistor 12.

An NPN transistor $T_3$ serves as a power driver with the base thereof coupled to the collector of the transistor $T_1$ and with the emitter thereof coupled to the power source terminal 2.

An NPN transistor $Q_1$ has its base connected to the collector of the power driver transistor $T_3$ through a bias circuit 3 and also to the power source terminal 1 through a constant current source 13. A PNP transistor $Q_2$ has its base connected to the collector of the NPN transistor $Q_1$ which is coupled to the power source terminal 1 through a resistor $R_4$. The emitter of the PNP transistor $Q_2$ is coupled to the power source terminal 1, and the collector thereof is coupled to the load $R_L$ through a resistor $R_1$. A diode $D_1$ is provided which has its positive and negative electrodes connected to the emitter of the NPN transistor $Q_1$ and the collector of the PNP transistor $Q_2$ respectively.

A PNP transistor $Q_3$ has its base connected direct to the collector of the power driver transistor $T_3$, and an NPN transistor $Q_4$ has its base connected direct to the collector of the PNP transistor $Q_3$ which is also coupled to the power source terminal 2 through a resistor $R_5$. The emitter of the NPN transistor $Q_4$ is connected to the power source terminal 2, and the collector thereof is coupled to the load $R_L$ through a resistor $R_2$. A second diode $D_2$ is provided which has its positive and negative electrodes connected to the collector of the NPN transistor $Q_4$ and the emitter of the PNP transistor $Q_3$ respectively.

Between the emitters of the transistors $Q_1$ and $Q_3$ is connected a resistor $R_3$ the function of which will be fully described later.

Description will now be made of the operation of the circuit shown in FIG. 1. When no signal is being applied to the input terminal 8, it is assumed that the voltages between the bases and the emitters of the transistors $Q_1$ and $Q_3$ and $V_{BE1}$ and $V_{BE3}$ respectively, that the forward voltage drops across the diodes $D_1$ and $D_2$ are $V_{D1}$ and $V_{D2}$ respectively, that the voltages across the resistor $R_3$ is $V_R$ and that the voltage across the bias circuit 3 is $V_b$, as shown in FIG. 2. In this case, the values of the resistors $R_1$ and $R_2$ are so small and the current flowing through the transistors $Q_2$ and $Q_4$ are so low that the voltage drops across these resistors can be neglected. Thus, it will readily be understood that the following equation holds:

$$V_b - V_{BE1} - V_{BE3} = V_R = V_{D1} + V_{D2}$$

When an input signal is applied to the input terminal 8, and during each positive half cycle thereof, it is assumed that a current I is caused to flow through the load $L_R$ as shown in FIG. 2. It is further assumed that the load current I is much greater than the bias current, and that the voltage variations at the operating points of the transistors $Q_1$ and $Q_2$ are $+\alpha$ and $-\beta$ respectively. Then, the foregoing equation can be rewritten as follows:

$$V_b - (V_{BE1} + \alpha) - (V_{BE3} - \beta)$$
$$= V_b - V_{BE1} - V_{BE3} - (\alpha - \beta)$$
$$= V_R - (\alpha - \beta) \text{ [Usually, } V_R > (\alpha - \beta)]$$

Normally, the voltage drop across the resistor $R_1$ due to the increase in the collector current is greater than the variations in the base-emitter voltage. Hence, the following relationships hold true:

$$(\alpha - \beta) < I.R_1$$

$V_R - (\alpha - \beta) < (V_{D1} + V_{D2} + I.R_2)$

In this case, the diode $D_1$ is rendered conductive by the fact that the emitter current of the transistor $Q_1$ flows therethrough, whereas the diode $D_2$ is rendered non-conductive by the fact that the voltage thereacross does not reach the level of the forward bias voltage thereof. Furthermore, the variation in the voltage across the resistor $R_3$ is small, and the current flowing therethrough is caused to flow through the transistor $Q_3$ as emitter current, so that the variation in the latter is also small. In this way, since the variation in the emitter current of the transistor $Q_3$ is small, the variation in the voltage drop across the resistor $R_5$ is also small, so that the transistor $Q_4$ is still conducting. Thus, during each positive half cycle of the input signal, both the transistors $Q_3$ and $Q_4$ are conducting so that the signal is subject to no notching distortion. During each negative half cycle of the input signal, the diode $D_1$ is rendered non-conductive, so that the transistors $Q_1$ and $Q_2$ are kept conductive by being supplied with the bias current, as will be readily apparent to those skilled in the art from what has been described above.

In order to keep the transistors $Q_2$ and $Q_4$ supplied with the bias current, the values for the resistors $R_4$ and $R_5$ for shunting the collector currents of the transistors $Q_1$ and $Q_3$ respectively, should preferably be selected to be sufficiently greater than the input impedances between the bases and the emitters of the transistors $Q_2$ and $Q_4$ so as to achieve constant-current driving.

As will be understood from the foregoing, according to this invention, the bias current flowing through the first transistor $Q_1$ will always be permitted to flow into the emitter of the transistor $Q_3$ via the resistor $R_3$, whether or not there is an input signal; The current increased by the input signal will be passed to the load through one of the diodes, and the voltage across the resistor $R_3$ will be prevented from changing by the other diode, so that the first and third transistors $Q_1$ and $Q_3$ will always be conducting. Thus, even when the operating point is set up to give Class B or similar operation, notching distortion can be avoided which results from switching of transistors. The same effect can be produced even when the resistors $R_1$ and $R_2$ are eliminated. Such resistors may be provided between the emitters of the second and fourth transistors $Q_2$ and $Q_4$ and the power source. In order to make the operation more effective, the bias circuit 3 should preferably be one which provides a constant voltage irrespective of input signals.

While the present invention has been described with respect to specific embodiments thereof, it should be understood that the invention is not restricted to those embodiments but various modifications may be made therein without departing from the spirit and scope of the invention as defined in the appended claims.

What is claimed is:

1. A low-frequency amplifier circuit arrangement designed for Class "B" or "AB" operation, comprising:

a first amplifier stage including a first transistor of a first conductivity-type and a second transistor of a second conductivity-type having the base thereof connected with the collector of said first transistor; a second amplifier stage including a third transistor of said second conductivity-type and a fourth transistor of said first conductivity-type having the base thereof connected with the collector of said third transistor; said second and fourth transistors having the collectors thereof connected to a load to alternately drive said load; and means for preventing said first and third transistors from being brought into cut-off condition, regardless of whether one of said second and fourth transistors are driving said load; said means comprising bias circuit means connected between the bases of said first and third transistors, a non-grounded resistor through which the emitters of said first and third transistors are connected to each other, a first diode having the anode and cathode thereof connected to the emitter of said first transistor and the collector of said second transistor respectively, and a second diode having the anode and cathode thereof connected to the collector of said fourth transistor and the emitter of said third transistor respectively.

* * * * *